US 6,690,226 B2

(12) United States Patent
Takai

(10) Patent No.: US 6,690,226 B2
(45) Date of Patent: Feb. 10, 2004

(54) SUBSTRATE ELECTRIC POTENTIAL SENSE CIRCUIT AND SUBSTRATE ELECTRIC POTENTIAL GENERATOR CIRCUIT

(75) Inventor: Yasuhiro Takai, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 139 days.

(21) Appl. No.: 09/863,789

(22) Filed: May 22, 2001

(65) Prior Publication Data

US 2002/0011893 A1 Jan. 31, 2002

(30) Foreign Application Priority Data

May 24, 2000 (JP) ........................ 2000-152946

(51) Int. Cl.[7] .................. H01J 19/82; H02M 71/00
(52) U.S. Cl. .................................. 327/530
(58) Field of Search ................ 257/48; 300/250, 300/252, 253, 254, 255, 256, 257, 259, 260, 261, 264; 327/530, 534, 535, 536, 537, 538, 548

(56) References Cited

U.S. PATENT DOCUMENTS

| 4,553,098 | A | * | 11/1985 | Yoh et al. ............... 324/433 |
| 5,268,600 | A | * | 12/1993 | Yeu ........................ 307/482 |
| 5,598,122 | A | * | 1/1997 | McClure ................. 327/538 |
| 5,886,543 | A | * | 3/1999 | Moody ................... 327/77 |
| 5,903,141 | A | * | 5/1999 | Tailliet ................... 323/312 |
| 5,942,933 | A | * | 8/1999 | Yang ...................... 327/530 |
| 6,043,968 | A | * | 3/2000 | Haruki .................... 361/111 |
| 6,147,549 | A | * | 11/2000 | Ohno ..................... 327/541 |
| 6,262,618 | B1 | * | 7/2001 | Maggiolino ............ 327/285 |
| 6,380,016 | B2 | * | 4/2002 | Kohler ................... 438/200 |

FOREIGN PATENT DOCUMENTS

| DE | 692 10 063 T2 | 8/1992 |
| DE | 197 49 602 A1 | 10/1998 |
| JP | 361251218 A | * | 11/1986 |
| JP | 2-3153 | 1/1990 |
| JP | 6-303765 | 10/1994 |

* cited by examiner

*Primary Examiner*—Wael Fahmy
*Assistant Examiner*—Dana Farahani
(74) *Attorney, Agent, or Firm*—Darryl G. Walker; Bradley T. Sako

(57) ABSTRACT

A semiconductor device having a substrate potential generating circuit (800) is provided. The substrate potential generating circuit (800) can include a pump circuit (820), an oscillator circuit (801) and a substrate potential detector circuit (300). Substrate potential detector circuit (300) can include a voltage divider (301), differential amplifier (310), and a buffer circuit (320). Voltage divider (301) can provide a detect potential determined by the difference between an internally generated reference potential and a substrate potential. Differential amplifier (310) can receive the detect potential and a reference potential as differential inputs and may produce a substrate potential detect signal. The internally generated reference potential may be generated by a reference generator (900), that may include a reference device (918) and a compensation device (920). The internally generated reference potential may have reduced process and temperature dependency. Thus, a substrate potential can be accurately regulated.

9 Claims, 5 Drawing Sheets

SUBSTRATE ELECTRIC POTENTIAL SENSE CIRCUIT AND SUBSTRATE ELECTRIC POTENTIAL GENERATOR CIRCUIT

TECHNICAL FIELD

The present invention relates generally to semiconductor devices and more particularly to a semiconductor memory device having a substrate potential detection circuit for allowing a stable substrate potential level to be generated and maintained.

BACKGROUND OF THE INVENTION

Semiconductor devices have been equipped with substrate potential generators (such as back bias generators) that generate a voltage potential to be applied to the substrate or a well. By applying a potential bias to the substrate, various improvements to circuit operation have been made.

In a semiconductor memory device, such as a dynamic random access memory (DRAM), the substrate has typically had a potential bias applied. This has been done for various reasons. One reason is to improve latch-up characteristics by decreasing the possibility of forward biasing p-n junctions that are formed between sources or drains of transistors and the substrate. Also, a biased substrate has the affect of decreasing junction capacitance. Another affect is an increase in threshold voltages of transistors formed in the substrate. In a DRAM memory array, a biased substrate can improve cell-to-cell isolation by keeping undesired transistors (thick field devices) from being formed between memory cells. It can also decrease sub-threshold leakage in the memory cell transistor by increasing the cell transistor's threshold voltage.

For example, in a conventional DRAM memory cell the threshold voltage $V_T$ of a memory cell transistor is about 1.2 V and the substrate potential (back bias potential) is set to about $-2$ V.

In order to decrease the chip size of a semiconductor memory, such as a DRAM, device sizes are continuously made smaller. In the memory cell array, the memory cell transistor can have a gate length that is reduced. This can cause the memory cell transistor's threshold voltage $V_T$ to be reduced, which can contribute to charge leaking from a memory cell capacitor through the transistor by way of sub-threshold leakage.

Also, due to the memory cell transistor gate length becoming smaller, the depletion region formed by the p-n junctions of the source/drain regions to the substrate can be excessively large with respect to the gate length. In order to narrow these depletion regions, a higher concentration of dopant is implanted in the substrate. However, the narrower depletion region results in a higher electric field intensity. This higher electric field intensity can result in an increased charge leakage from the memory cell storage capacitor to the substrate by way of the p-n junction.

These charge leakage paths from the memory cell storage capacitor shorten the amount of time that charge can be held on the capacitor. This affects data integrity, in particular, the pause/refresh characteristics of the DRAM and decreases the reliability of the DRAM.

It is desired to keep the $V_T$ of the memory cell transistor at an adequate value while providing a minimum gate length. However, the substrate potential needs to be set at about $-0.5$ V to limit the intensity of the electric field at the p-n junction formed from the memory cell capacitor contact (source/drain region of memory cell transistor) and the substrate.

Current may flow to the substrate during various operating conditions of a DRAM. One example of an operating condition in which a relatively large amount of current can flow to the substrate is a data sensing operation. In a DRAM, due to the destructive nature of a read and the large number of memory cells selected during a read of a single bit, a large number of sense amplifiers are activated simultaneously. Each sense amplifier is biased in such a condition that a relatively large amount of current is injected into the substrate during the sensing operation. This can drastically affect the substrate potential.

In order to keep the substrate potential at about $-0.5$ V, an accurate substrate potential detector circuit is needed. Based on an output of the substrate potential detector circuit a substrate potential generator (substrate pump) can either be enabled or disabled based on whether the substrate potential is above or below $-0.5$ V.

One example of a conventional substrate voltage detector circuit has been disclosed in Japanese Patent Publication No. Hei 2-3153. Referring now to FIG. 1, a conventional substrate voltage detector circuit as disclosed in Japanese Patent Publication No. Hei 2-3153 is set forth in a circuit schematic diagram and given the general reference character 100.

Conventional substrate voltage detector circuit 100 includes P-type metal-oxide-semiconductor field effect transistors (MOSFET) (101, 103, and 104) and N-type MOSFETs (102 and 105). P-type MOSFET 103 has a source connected to supply voltage $V_{CC}$, a drain connected to detection node N2 and a gate connected to ground voltage $V_{SS}$. P-type MOSFET 101 has a source connected to a source of N-type MOSFET 102 and a drain and gate connected to the substrate potential $V_{BB}$. N-type MOSFET 102 has a drain connected to detection node N2 and a gate connected to supply voltage $V_{CC}$.

P-type MOSFET 104 has a source connected to supply voltage $V_{CC}$, a drain connected to substrate level detect signal node N3, and a gate connected to detection node N2. N-type MOSFET 105 has a source connected to ground voltage $V_{SS}$, a drain connected to substrate level detect signal node N3, and a gate connected to detection node N2. P-type MOSFET 104 and N-type MOSFET 105 form an inverter 106.

The operation of conventional substrate voltage detector circuit 100 will now be described.

P-type MOSFET 103 and N-type MOSFET 102 have gate voltages that keep both MOSFETs (102 and 103) in a conducting state. P-type MOSFET 103 and N-type MOSFET 102 form a voltage divider circuit with P-type MOSFET 103 having a resistance of $R_2$ and N-type MOSFET 102 having a resistance of $R_1$. If P-type MOSFET 101 is relatively large compared to P-type MOSFET 103 and N-type MOSFET 102, the detection node potential $V_A$ at detection node N2 is given by the following equation: $V_A = (R_1/(R_1+R_2)) \times V_{CC} + (R_1/(R_1+R_2)) \times (V_{BB}+V_T)$, where $V_T$ is the threshold voltage of P-type MOSFET 101.

When the detection node potential $V_A$ falls below the trip point of inverter 106, substrate level detect signal node N3 becomes logic high. When the detection node potential $V_A$ rises above the trip point of inverter 106, substrate level detect signal node N3 becomes logic low.

Because the detection node potential $V_A$ is dependent on the substrate potential $V_{BB}$, when substrate potential $V_{BB}$ falls below a predetermined potential, level detect signal node N3 becomes logic high. When substrate potential $V_{BB}$ rises above a predetermined potential, level detect signal node N3 becomes logic low. When at a logic low, level detect signal N3 activates an oscillator (not shown). When at a logic high, level detect signal N3 disables the oscillator. The oscillator is connected to a substrate pump (also not shown) and in this manner, the substrate potential $V_{BB}$ is regulated.

Another example of a conventional substrate voltage detector circuit has been disclosed in Japanese Laid-Open Patent Publication No. Hei 6-303765. Referring now to FIG. 2, a conventional substrate voltage detector circuit as disclosed in Japanese Laid-Open Patent Publication No. Hei 6-303765 is set forth in a circuit schematic diagram and given the general reference character 200.

Conventional substrate voltage detector circuit 200 includes voltage dividers 211 and 212, differential amplifier 218, inverters (219 and 220) and latching circuit 221.

Voltage divider 211 includes resistors (213 and 214). Resistor 213 is connected between a supply voltage $V_{CC}$ and a reference node N201. Resistor 214 is connected between a reference node N201 and a ground voltage $V_{SS}$.

Voltage divider 212 includes resistors (215, 216 and 217). Resistor 215 is connected between a supply voltage $V_{CC}$ and a substrate reference node N202. Resistor 216 is connected between a substrate reference node N202 and resistor 216. Resistor 217 is connected between resistor 216 and a substrate potential $V_{BB}$.

Differential amplifier 218 has a positive input connected to reference node N201, a negative input connected to substrate reference node N202, and an output VOUT connected to an input of inverter 219. Inverter 219 has an output connected to an input of inverter 220. Inverter 220 has an output connected to an input of latching circuit 221. Latching circuit 221 provides a substrate level detect signal φUP. Latching circuit 221 has two inverters (222 and 223), each having a respective output connected to the respective input of the other.

The operation of conventional substrate voltage detector circuit 200 will now be described.

A reference potential $V_{CCREF}$ is generated at reference node N201 as determined by the values of the resistance of resistors (213 and 214). A substrate reference $V_{BBREF}$ is generated at reference node N202 as determined by the values of the resistance of resistors (215, 216, and 217). If substrate reference potential $V_{BBREF}$ is higher than reference potential $V_{CCREF}$, then the output VOUT of differential amplifier 218 goes low and substrate level detect signal φUP goes high. If substrate reference potential $V_{BBREF}$ is lower than reference potential $V_{CCREF}$, then the output VOUT of differential amplifier 218 goes high and substrate level detect signal φUP goes low.

Because the substrate reference potential $V_{BBREF}$ is dependent on the substrate potential $V_{BB}$, when substrate potential $V_{BB}$ falls below a predetermined potential, substrate level detect signal φUP becomes logic low. When substrate potential $V_{BB}$ rises above a predetermined potential, substrate level detect signal φUP becomes logic high. When at a logic high, substrate level detect signal φUP activates an oscillator (not shown) or clock generation circuit (not shown). When at a logic low, substrate level detect signal φUP disables the oscillator or clock generation circuit. The oscillator or clock generation circuit is connected to a substrate pump (also not shown) and in this manner, the substrate potential $V_{BB}$ is regulated.

There are drawbacks to the conventional substrate voltage detector circuits (100 and 200) illustrated in FIGS. 1 and 2.

In conventional substrate voltage detector circuit 100 illustrated in FIG. 1, detection node potential $V_A$ is dependent upon process variations that may occur in the fabrication of MOSFETs (101, 102, and 103). Thus, the substrate potential $V_{BB}$ becomes dependent upon these process variations. Therefore, the substrate potential $V_{BB}$ can be different from chip to chip.

Also, in conventional substrate voltage detector circuit 100, the response time for the correct determination of substrate potential $V_{BB}$ can be slow due to both MOSFETs (104 and 105) conducting as detection node potential $V_A$ approaches the trip-point of inverter 106. If the conventional substrate voltage detector circuit 100 doesn't respond quickly to a collapse of the substrate potential $V_{BB}$, latch-up can occur during conditions, such as sensing, when the substrate current can be large.

In conventional substrate voltage detector circuit 200 illustrated in FIG. 2, resistors (213 to 217) are used to generate the substrate reference potential $V_{BBREF}$ and reference potential $V_{CCREF}$. However, these resistors can occupy a large amount of device area, which can increase the size of the semiconductor device. This has adverse affects on the cost of manufacturing a large quantity of devices because fewer devices can be manufactured on a single wafer. Also, the voltage dividers (211 and 212) constantly conduct current. This has adverse affects to standby current in the semiconductor device. This is particularly disadvantageous in a DRAM that is to be used in a product that operates off a battery, such as a laptop computer or personal digital assistant, as just two examples.

In view of the above discussion, it would be desirable to provide a semiconductor device having a substrate potential detector circuit capable of accurately detecting a substrate potential. It would also be desirable to provide a substrate potential generator circuit including a substrate potential detector circuit, that can control the substrate potential. It would also be desirable for a substrate potential detector circuit capable of accurately detecting a substrate potential with less dependency on process variations. It would also be desirable for a substrate potential detector circuit to be capable of accurately detecting a substrate potential while occupying less device area. It would also be desirable for a substrate potential detector circuit to be capable of accurately detecting a substrate potential while consuming a lower amount of standby current.

SUMMARY OF THE INVENTION

According to the present embodiments, a semiconductor device having a substrate potential generating circuit is provided. The substrate potential generating circuit may include a pump circuit, an oscillator circuit, and a substrate potential detector circuit. Substrate potential detector circuit may include a voltage translator and differential amplifier. Voltage translator may provide a detection potential determined by the difference between an internally generated reference potential and a substrate potential. The differential amplifier may receive the detection potential and a reference potential as differential inputs and may produce a substrate potential detect signal.

According to one aspect of the embodiments, the voltage translator can include a plurality of resistive elements couple in series to form a voltage divider for providing the detection potential.

According to another aspect of the embodiments, the plurality of resistive elements may be passive resistive elements.

According to another aspect of the embodiments, the plurality of resistive elements may be IGFETs of the same conductivity type.

According to another aspect of the embodiments, the plurality of resistive elements may be IGFETs of opposite conductivity type.

According to another aspect of the embodiments, the internally generated reference potential coupled to the voltage translator in the substrate potential detector can be a supply potential for a peripheral circuit.

According to another aspect of the embodiments, internally generated reference potential coupled to the voltage translator in the substrate potential detector can be a supply potential for a sense amplifier circuit.

According to another aspect of the embodiments, the reference potential input to a reference potential terminal of the differential amplifier in the substrate potential detector can be a ground potential.

According to another aspect of the embodiments, the reference potential input to a reference potential terminal of the differential amplifier in the substrate potential detector can be an internally generated potential. The internally generated potential can be a supply potential for other circuits on the semiconductor device.

According to another aspect of the embodiments, differential amplifier in the substrate potential detector can include a current mirror load circuit.

According to another aspect of the embodiments, the substrate potential detection circuit can include a buffer circuit coupled to the differential amplifier and generating the substrate potential detect circuit.

According to another aspect of the embodiments, a reference generator can generate the internally generated reference potential coupled to the voltage translator circuit in the substrate potential detection circuit. The reference generator can include a reference circuit and a buffer circuit.

According to another aspect of the embodiments, the reference circuit can provide a reference potential dependent upon a threshold voltage of a reference device.

According to another aspect of the embodiments, the reference circuit can include a compensation device providing compensation for process and temperature variations in at least one parameter of the reference device.

According to another aspect of the embodiments, the buffer circuit in the reference generator can receive a reference potential from the reference circuit and provide the internally generated reference potential. The internally generated reference potential can have a different value than the reference potential from the reference circuit.

According to another aspect of the embodiments, the buffer circuit can include a differential amplifier and a voltage translator circuit. The differential amplifier can receive the reference potential from the reference circuit as one input and a feedback signal from the voltage translator as another input. The differential amplifier can provide a control signal for an output device of the voltage translator. The voltage translator can include a voltage divider circuit.

According to another aspect of the embodiments, substrate potential detector circuit can provide a control signal to an oscillator. The oscillator may provide an oscillator signal to a substrate pump circuit. The substrate potential may be accurately controlled.

DETAILED DESCRIPTION OF THE EMBODIMENTS

Various embodiments of the present invention will now be described in detail with reference to a number of drawings.

Figure 3:
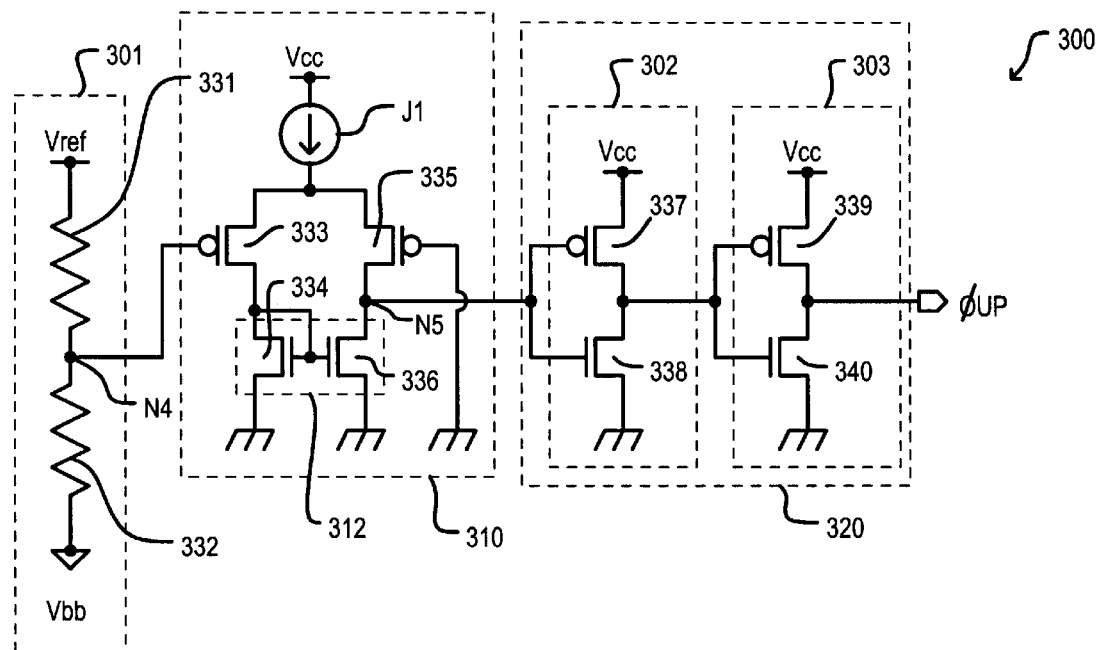
FIG. 3 is a circuit schematic diagram of a substrate voltage detector circuit according to one embodiment.

Referring now to FIG. 3, a substrate voltage detector circuit according to one embodiment is set forth in a circuit schematic diagram and given the general reference character 300.

Substrate voltage detector circuit 300 can include a voltage divider 301, a differential amplifier 310, and a buffer circuit 320.

Voltage divider 301 can include resistive elements (331 and 332). Resistive element 331 may be connected between a reference potential $V_{REF}$ and a detection node N4. Resistive element 332 may be connected between detection node N4 and substrate potential $V_{BB}$.

Differential amplifier 310 can include an input transistor 333, reference transistor 335, load devices (334 and 336), and a current source J1. Differential amplifier 310 may be a current-mirror type differential amplifier, as just one example.

Load device 334 can be an N-type insulated gate field effect transistor (IGFET) and may have a source connected to ground voltage $V_{SS}$ and a drain and gate commonly connected to a drain of input transistor 333. Load device 336 can be an N-type IGFET and may have a source connected to ground voltage $V_{SS}$, a drain connected to differential amplifier output node N5, and gate connected to the gate of load device 334. Load devices (334 and 336) may form a current-mirror type active load for differential amplifier 310.

Input transistor 333 can have a control gate connected to detection node N4 and a source commonly connected to current source J1 and a source of reference transistor 335. Reference transistor 335 can have a control gate connected to ground voltage $V_{SS}$ and a drain connected to differential amplifier output node N5. Input transistor 333 and reference transistor 335 can be P-type IGFETs and may provide differential inputs to differential amplifier 310.

Current source J1 may be connected between a supply voltage $V_{CC}$ and a common connection of sources of input transistor 333 and reference transistor 335.

Buffer circuit 320 can include inverters (302 and 303). Inverter 302 can receive differential amplifier output node N5 as an input and may provide an output to an input of inverter 303. Inverter 303 may provide substrate level detect signal φUP as an output. Inverter 302 can include transistors (337 and 338). Transistor 337 can have a source connected to supply voltage $V_{CC}$, a gate connected to differential amplifier output node N5, and a drain connected to the drain of transistor 338 at an output node. Transistor 338 can have a gate connected to differential amplifier output node N5 and a source connected to ground voltage $V_{SS}$. Inverter 303 can include transistors (339 and 340). Transistor 339 can have a source connected to supply voltage $V_{CC}$, a gate connected to the output of inverter 302, and a drain connected to the drain of transistor 340 at an output node. Transistor 340 can have a gate connected to the output of inverter 302 and a source connected to ground voltage $V_{SS}$. Transistors (337 and 339) can be P-type IGFETS and transistors (338 and 340) can be N-type IGFETs.

Figure 8:
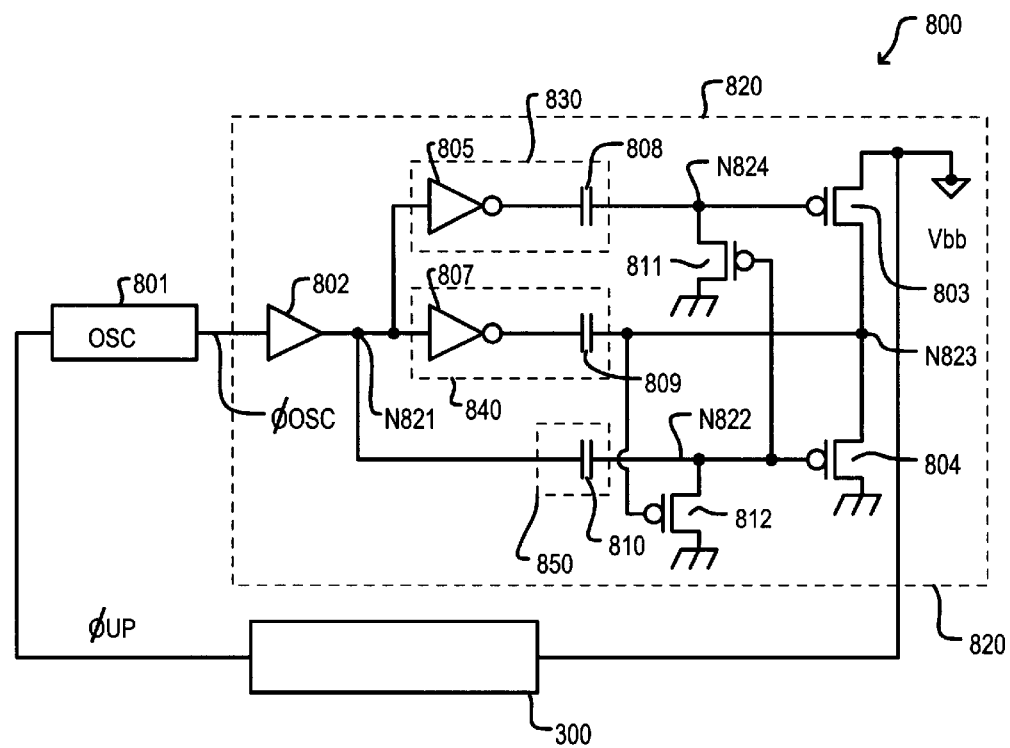
FIG. 8 is a circuit schematic diagram of a substrate potential generating circuit according to one embodiment.

Referring now to FIG. 8, a substrate potential generating circuit according to one embodiment is set forth in a circuit schematic diagram and given the general reference character 800.

Substrate potential generating circuit 800 can include substrate voltage detector circuit 300, oscillator circuit 801, and a pump circuit 820.

Substrate voltage detector circuit 300 can receive the substrate potential $V_{BB}$ and provide substrate level detect signal φUP as an output. Oscillator circuit 801 can receive substrate level detect signal φUP and provide an oscillator signal φOSC as an output. Pump circuit 820 can receive oscillator signal φOSC as an input and may generate substrate potential $V_{BB}$ as an output.

Substrate pump circuit 820 can include a buffer circuit 802, an output control boost circuit 830, a substrate charge supplying circuit 840, a precharge control boost circuit 850, precharge devices (811, 812, and 804) and an output device 803.

Buffer circuit 802 can receive oscillator signal φOSC as an input and provide an output at node N821 to output control boost circuit 830, substrate charge supplying circuit 840, and precharge control boost circuit 850.

Output control boost circuit 830 can receive oscillator signal φOSC (through buffer circuit 802) and can provide an output control boost signal at node N824 to a control node of output device 803. Output control boost circuit 830 can include an inverter 805 and a boost capacitor 808. Inverter 805 can receive oscillator signal φOSC (through buffer circuit 802) and provide an output to a terminal of boost capacitor 808. Boost capacitor 808 can be connected between the output of inverter 805 and a control node of output device 803.

Substrate charge supply circuit 840 can receive oscillator signal φOSC (through buffer circuit 802) and can provide charge at a substrate charge supply node N823. Substrate charge supply circuit 840 can include an inverter 807 and a boost capacitor 809. Inverter 807 can receive oscillator signal φOSC (through buffer circuit 802) and provide an output to a terminal of boost capacitor 809. Boost capacitor 809 can be connected between the output of inverter 807 and substrate charge supply node N823.

Precharge control boost circuit 850 can receive oscillator signal φOSC (through buffer circuit 802) and can provide a precharge control boost signal at node N822 to a control node of precharge devices (811 and 804). Precharge control boost circuit 850 can include a boost capacitor 810. Boost capacitor 810 can be connected between the output of buffer 802 and control gates of precharge devices (811 and 804).

Precharge device 811 may be a P-type IGFET. Precharge device 811 may have a drain connected to a gate of output device 803 and a terminal of boost capacitor 808 at node N824, a source connected to ground voltage $V_{SS}$, and a control gate connected to node N822.

Precharge device 812 may be a P-type IGFET. Precharge device 812 may have a drain connected to a gate of pre-charge devices (804 and 811) and a terminal of boost capacitor 810 at node N822, a source connected to ground voltage $V_{SS}$, and a control gate connected to node N823.

Precharge device 804 may be a P-type IGFET. Precharge device 804 may have a drain connected to a gate of precharge device 812, a terminal of boost capacitor 809, and output device 803 at node N823. Precharge device 804 may have a source connected to ground voltage $V_{SS}$ and a control gate connected to node N822.

Output device 803 may be a P-type IGFET. Output device 803 may have a source connected to node N823, a drain connected to substrate potential $V_{BB}$, and a control gate connected to receive output control boost signal at node N824.

Figure 9:
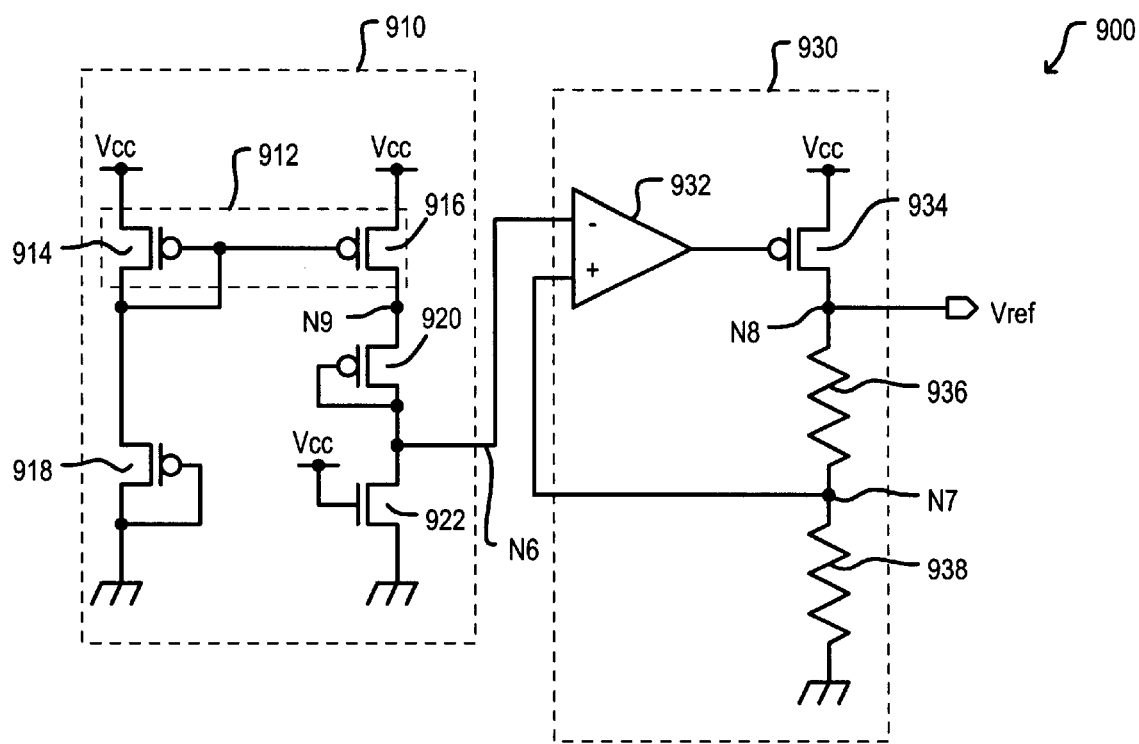
FIG. 9 is a circuit schematic diagram of a reference generator circuit according to one embodiment.

Referring now to FIG. 9, a reference generator circuit according to one embodiment is set forth in a circuit schematic diagram and given the general reference character 900.

Reference generator circuit 900 can include a reference circuit 910, and a voltage translator buffer circuit 930.

Reference circuit 910 can generate a reference potential at node N6. Voltage translator buffer circuit 930 can receive the reference potential at node N6 and may generate reference potential $V_{REF}$ as an output.

Reference circuit 910 can include a current mirror circuit 912, a reference device 918, a compensation device 920, and a load device 922. Current mirror circuit 912 can include current source devices (914 and 916). Current source devices (914 and 916) can be P-type IGFETs. Current source device 914 can have a source connected to supply voltage $V_{CC}$, a control gate and drain commonly connected to a control gate of current source device 916 and a source of reference device 918. Reference device 918 can be a P-type IGFET. Reference device 918 can have a control gate and drain commonly connected to ground voltage $V_{SS}$. Current source device 916 can be a P-type IGFET. Current source device 916 may have a source connected to supply voltage $V_{CC}$ and a drain connected to a source of compensation device 920. Compensation device 920 may be a P-type IGFET and may have a drain and control gate commonly connected to a drain of load transistor 922 at node N6. Load transistor 922 may be an N-type IGFET. Load transistor 922 may have a control gate connected to supply voltage $V_{CC}$ and a source connected to ground voltage $V_{SS}$.

Voltage translator buffer circuit 930 can include a differential amplifier 932, output device 934, and resistive elements (936 and 938). Differential amplifier 932 can receive a reference voltage from node N6 of reference circuit 910 at a negative input terminal. Differential amplifier 932 can receive a feedback potential from node N7 at a positive terminal and may provide an output to the control terminal of output device 934.

Output device 934 may be a P-type IGFET. Output device may have a source connected to supply voltage $V_{CC}$ and a drain connected to node N8. Node N8 may be an output node providing the reference potential $V_{REF}$ as an output. Resistive element 936 can be connected between node N8 and node N7. Resistive element 938 can be connected between node N7 and ground voltage $V_{SS}$.

The operation of reference generator circuit 900 will now be described.

Reference device 918 may be a high threshold voltage ($V_T$) device. For example, reference device 918 may have a $V_T$ of approximately 1.5 V. Current source device 914 and reference device 918 may provide a current path from supply voltage $V_{CC}$ to ground voltage $V_{SS}$. Also, reference device 918 may be sufficiently large as compared to current source device 914, so that the potential at the drain terminal of current source device 914 can be approximately 1.5 V. The current flowing through current source device 914 can be mirrored in current source device 916 and the voltage of node N9 can be approximately 1.5 V. Compensation device 920 can have a $V_T$ of approximately 0.6 V. Compensation device 920 can be configured in a diode type configuration and may provide an approximately 0.6 V drop. Thus, the reference potential at node N6 may be approximately 0.9 V.

It can be seen that the reference potential at node N6 may be dependent upon the $V_T$ of reference device 918 minus the $V_T$ of compensation device 920. Thus, if there is a temperature dependency on the $V_T$ of these devices, this dependency may be cancelled or compensated because reference device 918 may add the temperature dependency, but compensation device 920 may subtract the temperature dependency, which can have a canceling result. Thus, the reference potential inputted into the voltage translator buffer circuit 930 may have a reduced dependency upon temperature.

In the same manner, because many process steps and the process environment may be shared when manufacturing reference device 918 and compensation device 920, process variations may have a reduced affect on the reference potential generated at node N6.

The reference potential of approximately 0.9 V generated by reference circuit 910 may be provided as an input to voltage translator buffer circuit 930. If the potential at node N7 is less than the potential at node N6, the output of differential amplifier 932 can be low. Output device 934 can be turned on or have a decreased impedance, which can increase the current flowing through resistive elements (936 and 938) and may increase the reference potential $V_{REF}$ at node N8 and at node N7. If the potential at node N7 is greater than the potential at node N6, the output of differential amplifier 932 can be high. Output device 934 can be turned off or have an increased impedance, which can decrease the current flowing through resistive elements (936 and 938) and may decrease the reference potential $V_{REF}$ at node N8 and at node N7. With this type of negative feedback, the potential at node N7 can be forced to be approximately the same as the potential at node N6 or approximately 0.9 V.

Resistive elements (936 and 938) can have a ratio of approximately 1.1:0.9. This can cause the reference potential $V_{REF}$ at node N8 to be controlled at approximately 2.0 V.

Thus, voltage translator buffer circuit 930 can receive a reference potential of approximately 0.9 V and provide a "stepped up" reference potential $V_{REF}$ of approximately 2.0 V.

Now, the operation of substrate voltage detector circuit 300 will be described with reference to FIG. 3.

Reference potential $V_{RF}$ of approximately 2.0 V, generated by reference generator circuit 900 may be applied to voltage divider circuit 301 at one terminal. The other terminal of voltage divider circuit 301 may receive the substrate potential $V_{BB}$. Resistive elements (331 and 332) may have a ratio of resistances of approximately 4:1. Thus, if substrate potential $V_{BB}$ is lower than about −0.5 V, the potential of detection node N4 can be lower than the potential of ground voltage $V_{SS}$ (0 V). Thus, input transistor 333 can be turned on harder than reference transistor 335. This can allow differential amplifier output node N5 to be pulled low. Buffer circuit 320 can receive the signal from differential amplifier output node N5 and provide a logic low substrate level detect signal $\phi$UP as an output. However, if substrate potential $V_{BB}$ is higher than about −0.5 V, the potential of detection node N4 can be higher than the potential of ground voltage $V_{SS}$ (0 V). Thus, reference transistor 335 can be turned on harder than input transistor 333. This can allow differential amplifier output node N5 to be pulled high. Buffer circuit 320 can receive the signal from differential amplifier output node N5 and provide a logic high substrate level detect signal $\phi$UP as an output.

Referring now to FIG. 8, substrate level detect signal $\phi$UP can be input into oscillator circuit 801. If substrate level detect signal $\phi$UP is logic low, the substrate potential substrate potential $V_{BB}$ may be too low (too deep) and the oscillator circuit 801 may be disabled. With oscillator circuit 801 disabled, substrate pump 820 can be disabled and may have no affect on the substrate potential $V_{BB}$. However, if substrate level detect signal $\phi$UP is logic high, the substrate potential substrate potential $V_{BB}$ may be too high (too shallow) and the oscillator circuit 801 may be enabled. With oscillator circuit 801 enabled, oscillator circuit 801 may provide an oscillator signal $\phi$OSC to substrate pump 820. Oscillator signal $\phi$OSC may be a periodic waveform alternately switching from high to low and low to high in a periodic fashion. Substrate pump 820 can pump the substrate by removing charge and can cause the substrate potential $V_{BB}$ to become lower (or deeper).

Thus, if the substrate potential $V_{BB}$ is too shallow (greater than about −0.5 V), the substrate potential generating circuit 800 can become enabled and may pump the substrate to a deeper level. Once the substrate potential $V_{BB}$ becomes deep enough (less than about −0.5 V), the substrate potential generating circuit 800 can become disabled. The substrate may then float until the substrate potential $V_{BB}$ becomes too shallow. This can allow the substrate potential $V_{BB}$ to be regulated at approximately −0.5 V, as just one example.

The operation of substrate pump 820 will now be discussed with reference to FIG. 8.

When oscillator signal $\phi$OSC transitions from low to high, charge supply circuit 840 may produce a potential at node N823 that may be more negative than the absolute value of a threshold voltage $V_T$ of precharge device 812. Thus, precharge device 812 may be turned on and node N822 may be precharged to ground potential $V_{SS}$. This may turn off precharge devices (804 and 811). At the same time, output control boost circuit 830 may provide a potential at node N824 that may be lower than substrate potential $V_{BB}$ minus the absolute value of a threshold voltage $V_T$ of output device 803. This may turn on output device 803 and may allow substrate charge supply circuit 840 to pump the substrate to a lower potential (deeper).

When oscillator signal $\phi$OSC transitions from high to low, precharge control boost circuit 850 may provide a potential at node N822 that may be more negative than the absolute value of a threshold voltage $V_T$ of precharge devices (804 and 811). This may turn on precharge devices (804 and 811). Thus, nodes (N824 and N823) may be precharged to ground potential $V_{SS}$. With nodes (N824 and N823) precharged to ground potential, output device 803 and precharge device 812 may be turned off. At the same time, one terminal of charge capacitors (808 and 809) can have a high level applied (through output of inverters 805 and 807) and the other terminals (nodes N822 and N823) may have ground potential $V_{SS}$ applied. This can put charge capacitors (808 and 809) in a precharged condition, so that the next pumping cycle may begin at the next transition of oscillator signal $\phi$OSC and the substrate potential $V_{BB}$ can be regulated.

It is noted that the capacitance of the substrate is much larger than the capacitance of charge capacitor 809, thus the substrate potential $V_{BB}$ can change in small increments for each cycle of oscillator signal $\phi$OSC. Also, charge sharing between charge capacitor 809 and parasitic capacitors and gate capacitors (for example precharge device 812) at node N823 may further decrease the pumping efficiency of charge pump 820. On-resistances of transistors, such as precharge device 812 and output device 803, may cause voltage drops when conducting which may also decrease the efficiency of charge pump 820.

Figure 1:
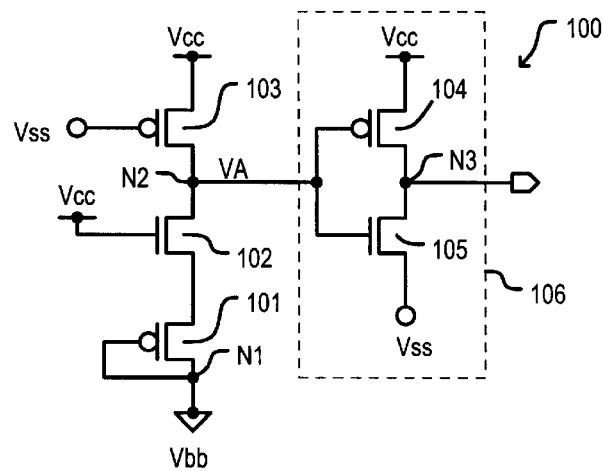
FIG. 1 is a circuit schematic diagram of a conventional substrate voltage detector circuit.

In the embodiment illustrated in FIGS. 1, 8, and 9, the substrate potential $V_{BB}$ can be determined by a resistance ratio of resistive devices (331 and 332). This may reduce process dependencies. The substrate potential $V_{BB}$ can be accurately detected and the response speed of the detection may be improved.

Figure 2:
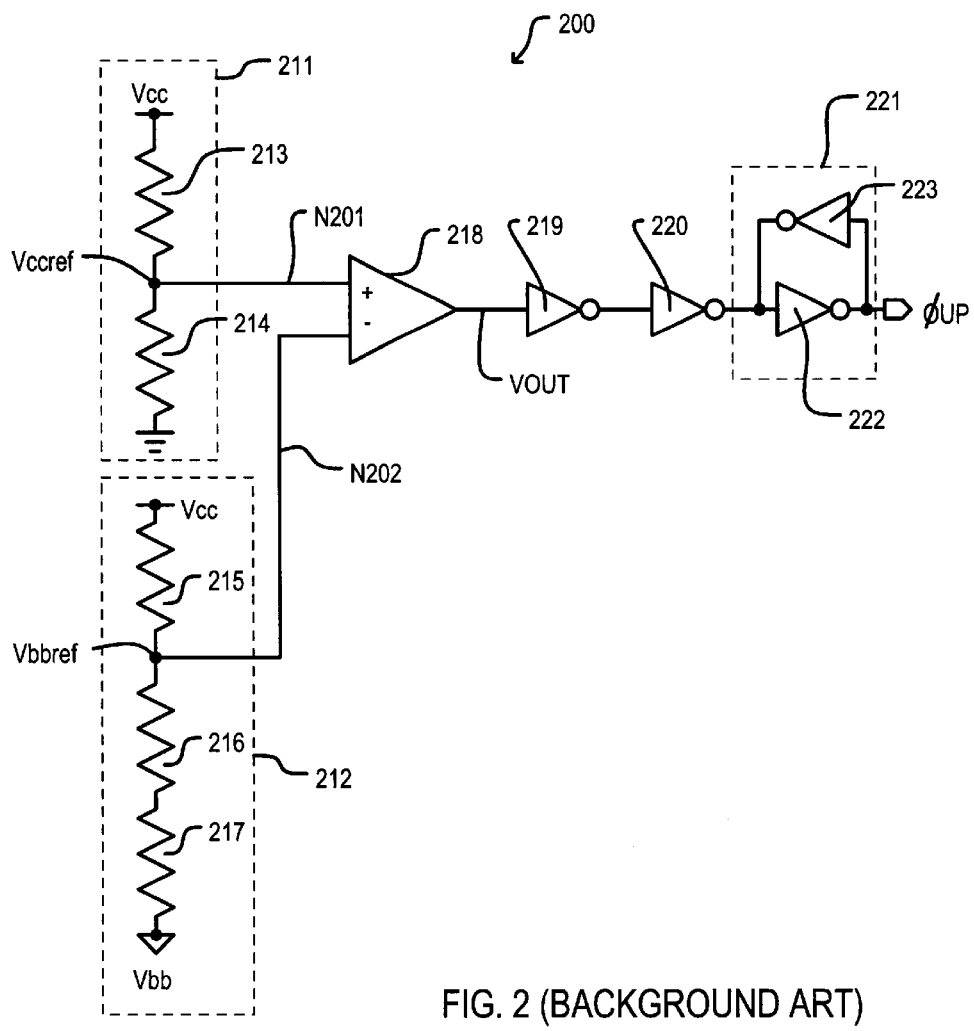
FIG. 2 is a circuit schematic diagram of a conventional substrate voltage detector circuit.

In the substrate potential detector circuit 300 of FIG. 3, substrate potential $V_{BB}$ can be detected by applying a potential of a detection node N4 as one input to a differential amplifier 310, while providing a ground potential $V_{SS}$ as another input. Thus, only one voltage divider circuit 301 may be needed as compared to the conventional potential detector circuit 200 of FIG. 2, in which two voltage divider circuits 211 and 212 are needed. This can reduce the chip area consumed by the substrate potential detector circuit and can reduce overall chip size. Also, standby current may be reduced because only one voltage divider circuit 301 may be consuming current. This can result in lower power consumption.

In the substrate potential detector circuit 300 of FIG. 3, a reference potential $V_{REF}$ can be applied as a reference voltage to voltage divider circuit 301. Because reference potential $V_{REF}$ may be an internally generated reference voltage with reduced dependency on temperature, process variations, and external power supply variations, the substrate potential $V_{BB}$ can be regulated with reduced dependency on the above-mentioned variations. Reference potential $V_{REF}$ of about 2.0 V may be used as a reference potential for core circuitry such as sense amplifier circuitry. However, it is noted that various internal reference potentials may be used, as just one example, a reference potential $V_{REF}$ of about 2.7 V as may be used for peripheral circuits. If a different reference potential $V_{RF}$ is used, the ratios of resistive elements (331 and 332) may need to be changed to provide a proper detection node N4 potential at the trip point of differential amplifier 310 for the desired substrate potential $V_{BB}$.

Figure 4:
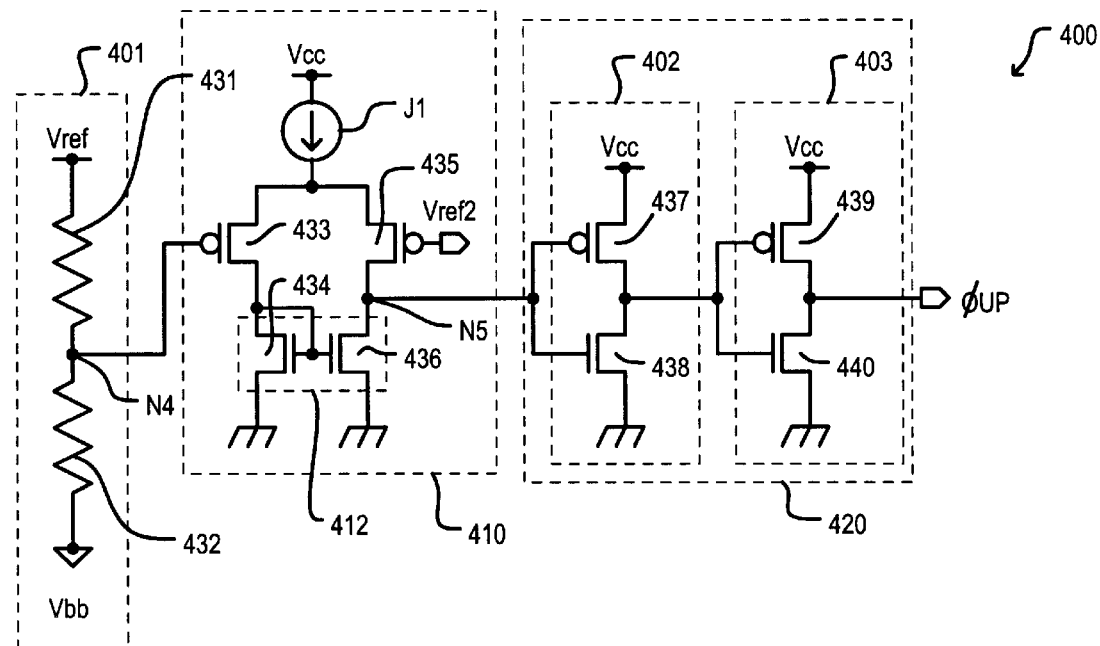
FIG. 4 is a circuit schematic diagram of a substrate voltage detector circuit according to one embodiment.

Referring now to FIG. 4, a substrate voltage detector circuit according to one embodiment is set forth in a circuit schematic diagram and given the general reference character 400. The substrate voltage detector circuit 400 can include similar constituents as the substrate voltage detector circuit 300 set forth in FIG. 3. To that extent, like constituents will be referred to by the same reference character, but with the first digit being a "4" instead of a "3."

Substrate voltage detector circuit 400 can differ from substrate voltage detector circuit 300 in that differential amplifier 410 can receive reference potential $V_{REF2}$ at the control terminal of reference device 435 instead of ground potential $V_{SS}$. Reference potential $V_{REF2}$ may be generated by the same type of reference generator 900 as illustrated in FIG. 9 and may be used as a reference potential for other circuits on the semiconductor device.

The resistance values (ratio) of resistive elements 431 and 432 can be set at such values that the potential at detection node N4 may be the same potential as reference potential $V_{REF2}$ when substrate potential $V_{BB}$ is at the desired potential.

If substrate potential $V_{BB}$ is too deep, the potential of detection node N4 can be lower than the potential of reference potential $V_{REF2}$. Thus, input transistor 433 can be turned on harder than reference transistor 435. This can allow differential amplifier output node N5 to be pulled low. Buffer circuit 420 can receive the signal from differential amplifier output node N5 and provide a logic low substrate level detect signal φUP as an output. However, if substrate potential $V_{BB}$ is too high, the potential of detection node N4 can be higher than the potential of reference potential $V_{REF2}$. Thus, reference transistor 435 can be turned on harder than input transistor 433. This can allow differential amplifier output node N5 to be pulled high. Buffer circuit 420 can receive the signal from differential amplifier output node N5 and provide a logic high substrate level detect signal φUP as an output.

Referring now to FIG. 8, substrate level detect signal φUP generated by substrate voltage detector circuit 400 can be input into oscillator circuit 801 to control the substrate potential $V_{BB}$ accordingly.

Figure 5:
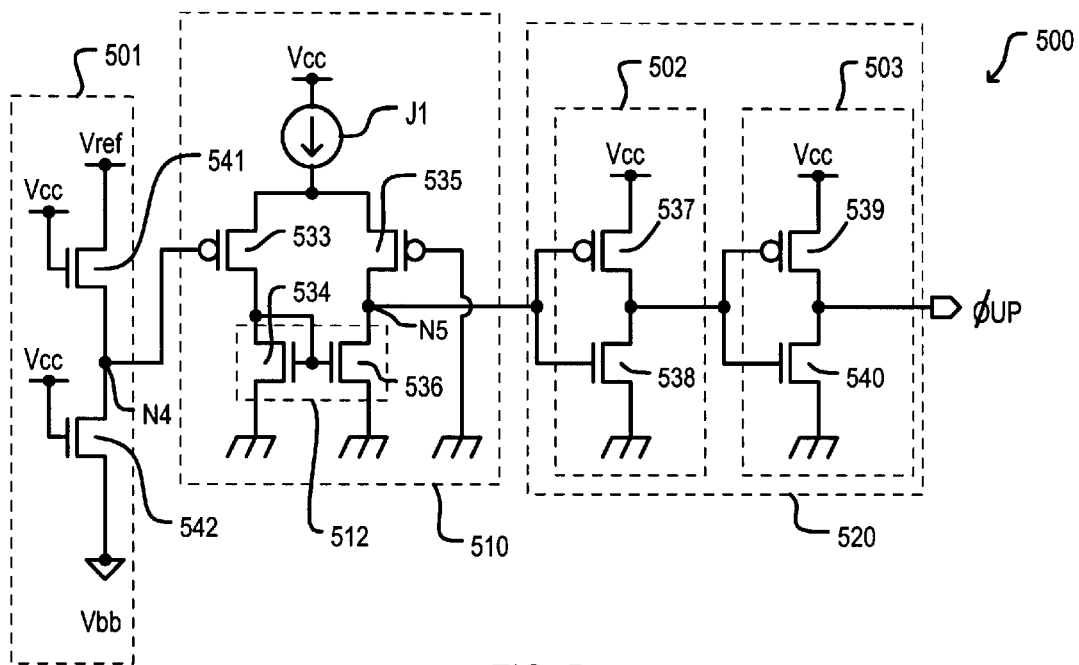
FIG. 5 is a circuit schematic diagram of a substrate voltage detector circuit according to one embodiment.

Referring now to FIG. 5, a substrate voltage detector circuit according to an embodiment is set forth in a circuit schematic diagram and given the general reference character 500. The substrate voltage detector circuit 500 can include similar constituents as the substrate voltage detector circuit 300 set forth in FIG. 3. To that extent, like constituents will be referred to by the same reference character, but with the first digit being a "5" instead of a "3."

Substrate voltage detector circuit 500 can differ from substrate voltage detector circuit 300 in that voltage divider circuit 501 can include resistive elements (541 and 542). Resistive elements (541 and 542) can be N-type IGFETs. Resistive element 541 can have a drain connected to reference potential $V_{REF}$, a source connected to detection node N4, and a control gate connected to supply potential $V_{CC}$. Resistive element 542 can have a drain connected to detection node N4, a source connected to substrate potential $V_{BB}$, and a control gate connected to supply potential $V_{CC}$. Resistive elements (541 and 542) can be in a conducting condition at all times such that the potential at detection node N4 can be dependent upon the ratios of their resistive values and the substrate potential $V_{BB}$. Substrate potential $V_{BB}$ can be thus sensed and controlled to provide a relatively constant substrate potential $V_{BB}$ similarly to the embodiments of FIGS. 3 and 4.

Because voltage divider 501 can be constructed with transistors instead of resistors, the device area consumed by substrate voltage detector circuit 500 may be reduced and chip size may be decreased.

Figure 6:
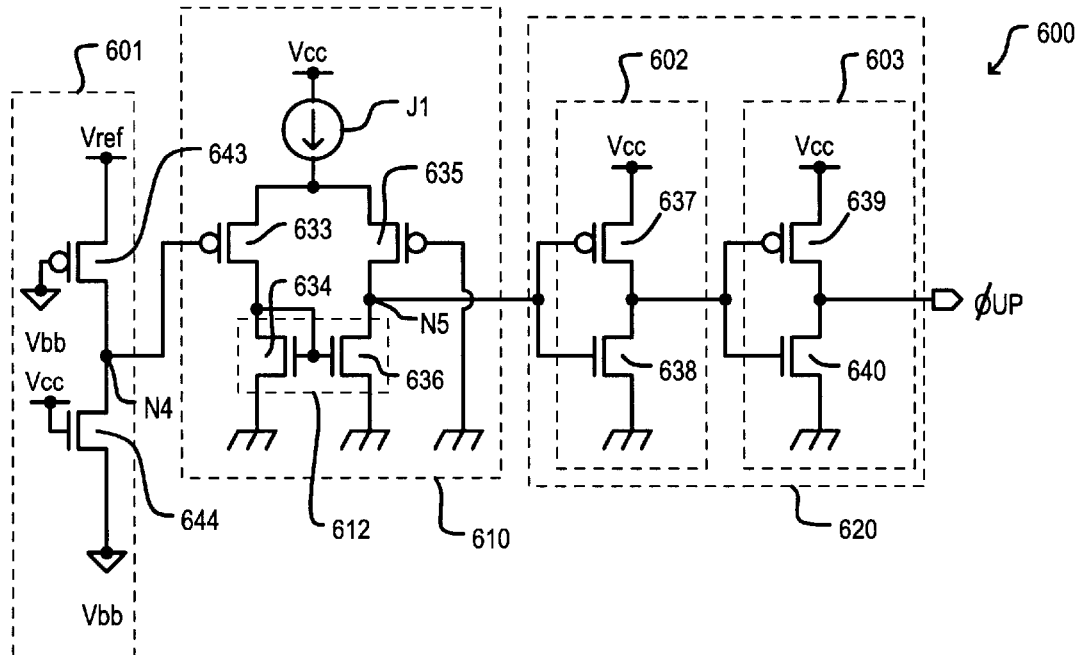
FIG. 6 is a circuit schematic diagram of a substrate voltage detector circuit according to one embodiment.

Referring now to FIG. 6, a substrate voltage detector circuit according to an embodiment is set forth in a circuit schematic diagram and given the general reference character 600. The substrate voltage detector circuit 600 can include similar constituents as the substrate voltage detector circuit 500 set forth in FIG. 5. To that extent, like constituents will be referred to by the same reference character, but with the first digit being a "6" instead of a "5."

Substrate voltage detector circuit 600 can differ from substrate voltage detector circuit 500 in that voltage divider circuit 601 can include resistive elements (643 and 644). Resistive element 643 can be a P-type IGFET and resistive element 644 can be an N-type IGFET. Resistive element 643 can have a source connected to reference potential $V_{REF}$, a drain connected to detection node N4, and a control gate connected to substrate potential $V_{BB}$. Resistive element 644 can have a drain connected to detection node N4, a source connected to substrate potential $V_{BB}$, and a control gate connected to supply potential $V_{CC}$. Resistive elements (643 and 644) can be in a conducting condition at all times such that the potential at detection node N4 can be dependent upon the ratios of their resistive values and the substrate potential $V_{BB}$. Substrate potential $V_{BB}$ can be thus sensed and controlled to provide a relatively constant substrate potential $V_{BB}$ similarly to the embodiments of FIGS. 3, 4 and 5.

Figure 7:
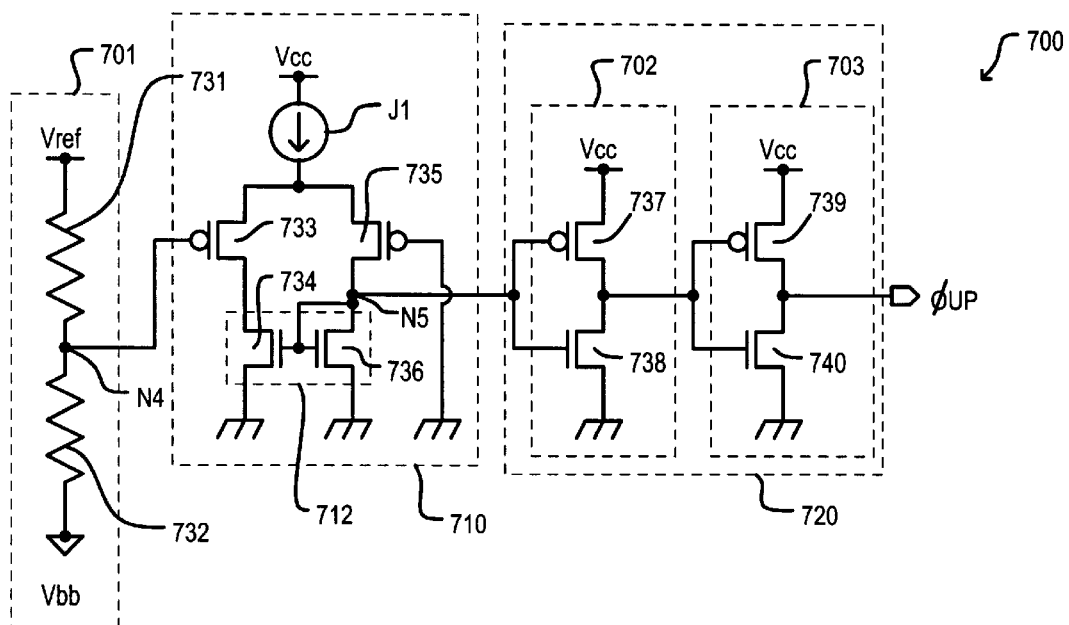
FIG. 7 is a circuit schematic diagram of a substrate voltage detector circuit according to one embodiment.

Referring now to FIG. 7, a substrate voltage detector circuit according to an embodiment is set forth in a circuit schematic diagram and given the general reference character 700. The substrate voltage detector circuit 700 can include similar constituents as the substrate voltage detector circuit 300 set forth in FIG. 3. To that extent, like constituents will be referred to by the same reference character, but with the first digit being a "7" instead of a "3."

Substrate voltage detector circuit 700 can differ from substrate voltage detector circuit 300 in that the connection of load devices (734 and 736) that make up a current mirror type circuit may be different. Load device 736 can be an N-type insulated gate field effect transistor (IGFET) and may have a source connected to ground voltage $V_{SS}$ and a drain and gate commonly connected to a drain of reference transistor 735. Load device 734 can be an N-type IGFET and may have a source connected to ground voltage $V_{SS}$, a drain connected to a drain of input transistor 733, and gate connected to the gate of load device 736. Load devices (734 and 736) can form a current-mirror type active load for differential amplifier 710. Substrate potential $V_{BB}$ can be thus sensed and controlled to provide a relatively constant substrate potential $V_{BB}$ similarly to the embodiments of FIGS. 3, 4, 5 and 6.

The embodiments described above can allow a substrate potential $V_{BB}$ to be accurately regulated with a reduced dependency on external power supply variations, process variations and environmental variations, such as temperature, as just one example.

It is understood that the embodiments described above are exemplary and the present invention should not be limited to those embodiments. Specific structures should not be limited to the described embodiments.

The voltage divider circuits (301, 401, 501, 601, and 701) may be conceptually viewed as a voltage translator in which a potential representing the substrate potential $V_{BB}$ may be generated at a detection node N4, for example.

For example, the power supply $V_{CC}$ connected to current source J1 may be an externally supplied power supply or may be an internally generated reference voltage.

Differential amplifier may be formed having complementary devices as compared to the embodiments, for example N-type IGFETs for differential inputs and P-type IGFETs for a current-mirror type active load.

Although the embodiments were discussed relating to substrate biasing, it is understood that a substrate may be a well in which devices are fabricated, as just one example. Also, although a negative boosted potential biasing was discussed, the embodiments may be applied to positive potential biasing, including positive boosted potential biasing, as just two examples.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A back-bias potential detector circuit, comprising:
    a voltage translator coupled to receive a back-bias potential and providing a detection potential having a potential dependent upon the back-bias potential;
    a differential amplifier circuit, that includes a current mirror load circuit, coupled to receive the detection potential at a first differential amplifier input terminal and a differential amplifier reference potential at a second differential amplifier input terminal and generating a back-bias level detect signal;
    a reference generator that generates a first internally generated reference potential and includes
        a reference circuit providing a reference circuit potential; and
        a buffer circuit coupled to receive the reference circuit potential and providing the first internally generated reference potential having a potential that is a different potential than the reference circuit potential, the buffer circuit further including
            a buffer differential amplifier circuit having a first buffer differential amplifier circuit input coupled to receive the reference circuit potential; and
            a voltage translation circuit providing the first internally generated reference potential and having a feedback node coupled to a second buffer differential amplifier circuit input.

2. The semiconductor device according to claim 1, wherein the reference circuit includes a reference device and the reference circuit potential is dependent upon a threshold voltage of the reference device.

3. The semiconductor device according to claim 2, wherein the reference circuit further includes a compensation device and the reference circuit potential is dependent upon a threshold voltage of the compensation device.

4. The semiconductor device according to claim 3, wherein the reference device has a threshold voltage of a larger magnitude than the threshold voltage of the compensation device.

5. A semiconductor device, comprising:
    a substrate potential detector circuit, including
        a voltage translator coupled to receive a boosted substrate potential and providing a detection potential having a potential dependent upon the boosted substrate potential, the voltage translator is coupled to receive the first internally generated reference potential and the detection potential is dependent upon a potential difference between the first internally generated reference potential and the boosted substrate potential;
        a differential amplifier circuit coupled to receive the detection potential at a first differential amplifier input terminal and a differential amplifier reference potential at a second differential amplifier input terminal and coupled to generate a potential detect signal; and
        a buffer coupled to the differential amplifier and generating a pump enable signal; and
    a charge pumping circuit coupled to receive the potential detect signal and having a pump enable state and a pump disable state and generating the boosted substrate potential.

6. The semiconductor device according to claim 5, wherein the voltage translator is a voltage divider circuit including a plurality of resistive elements coupled in series for providing the detection potential.

7. The semiconductor device according to claim 6, wherein the plurality of resistive elements are passive resistive elements.

8. The semiconductor device according to claim 6, wherein the plurality of resistive elements include first and second IGFETs having the same conductivity type.

9. The semiconductor device according to claim 6, wherein the plurality of resistive elements include first and second IGFETs having opposite conductivity types.

* * * * *